(12) United States Patent
Fu et al.

(10) Patent No.: US 9,705,016 B2
(45) Date of Patent: Jul. 11, 2017

(54) ADDITIVE FOR PREPARING SUEDE ON MONOCRYSTALLINE SILICON CHIP AND USE METHOD THEREOF

(71) Applicant: Changzhou Shichuang Energy Technology Co., Ltd., Changzhou, Jiangsu (CN)

(72) Inventors: Liming Fu, Jiangsu (CN); Peiliang Chen, Jiangsu (CN)

(73) Assignee: CHANGZHOU SHICHUANG ENERGY TECHNOLOGY CO., LTD. (CN)

( * ) Notice: Subject to any disclaimer, the term of this patent is extended or adjusted under 35 U.S.C. 154(b) by 0 days.

(21) Appl. No.: 14/376,499

(22) PCT Filed: Dec. 17, 2013

(86) PCT No.: PCT/CN2013/089672
§ 371 (c)(1),
(2) Date: Aug. 4, 2014

(87) PCT Pub. No.: WO2015/032153
PCT Pub. Date: Mar. 12, 2015

(65) Prior Publication Data
US 2016/0284880 A1  Sep. 29, 2016

(30) Foreign Application Priority Data
Sep. 4, 2013 (CN) .......................... 2013 1 0394735

(51) Int. Cl.
*H01L 31/0236* (2006.01)
*C30B 33/10* (2006.01)
*C30B 29/06* (2006.01)
*C30B 19/00* (2006.01)
*C30B 19/12* (2006.01)
*C30B 29/54* (2006.01)

(52) U.S. Cl.
CPC .......... *H01L 31/0236* (2013.01); *C30B 19/00* (2013.01); *C30B 19/12* (2013.01); *C30B 29/06* (2013.01); *C30B 29/54* (2013.01); *C30B 33/10* (2013.01); *Y02E 10/50* (2013.01)

(58) Field of Classification Search
CPC .................................................. H01L 21/31111
USPC ........................................................ 252/79.1
See application file for complete search history.

(56) References Cited

U.S. PATENT DOCUMENTS 7,150,959 B2 * 12/2006 Aoshima ............... B41C 1/1041
430/138

* cited by examiner

*Primary Examiner* — Gregory Webb

(57) ABSTRACT

The invention provides an additive for preparing suede on a monocrystalline silicon chip, which comprises: polyethylene glycol, sodium benzoate, citric acid, hydrolytic polymaleic anhydride, sodium acetate and water. The invention also provides a suede preparation liquid for preparing suede on a monocrystalline silicon chip, which contains the foregoing additive for preparing suede on a monocrystalline silicon chip and an aqueous alkali in a mass ratio of 0.2-5:100, wherein the aqueous alkali is the aqueous solution of an inorganic or organic alkali. The invention also provides a method for preparing suede on a monocrystalline silicon chip, by using which suede can be prepared on the surface of a monocrystalline silicon chip with the foregoing suede preparation liquid.

8 Claims, 1 Drawing Sheet

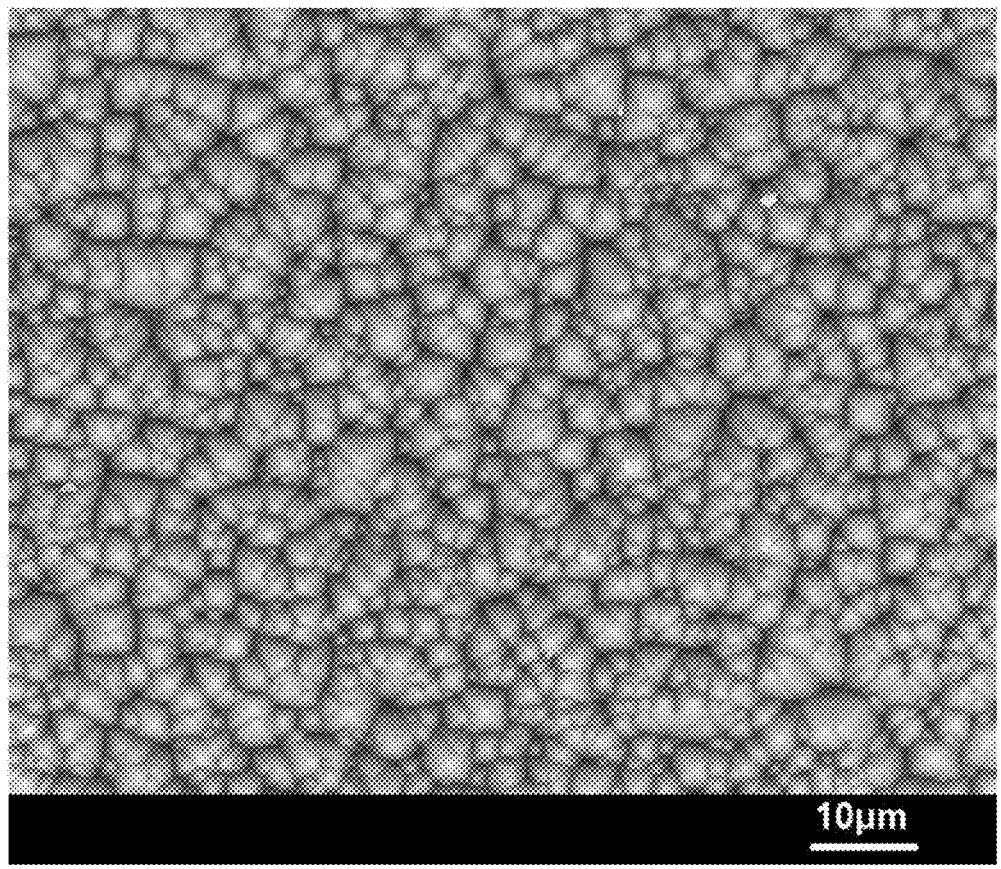

US 9,705,016 B2

ADDITIVE FOR PREPARING SUEDE ON MONOCRYSTALLINE SILICON CHIP AND USE METHOD THEREOF

FIELD OF THE INVENTION

The invention relates to an additive for preparing suede on a monocrystalline silicon chip and the use method thereof.

BACKGROUND OF THE INVENTION

To improve the performance and the efficiency of a solar cell slice, it is needed to form suede on the surface of a silicon chip during the preparation process of a solar cell slice as an effective suede structure enables incoming sunlight to be reflected and refracted on the surface of the silicon chip for many times to change the advancing direction of incoming light in silicon. On one hand, an optical path is extended to increase the infrared light absorption rate of the silicon chip, on the other hand, more photons are absorbed in an area nearby a pn junction to generate photon-generated carriers which can be collected more easily, thus the collection efficiency of photon-generated carriers is increased.

At present, the ordinary suede preparation technologies generally prepare suede by adding a proper amount of the mixture solution of isopropyl alcohol and sodium silicate into sodium hydroxide or potassium hydroxide. These suede preparation technologies have the following disadvantages: it takes a long time to prepare suede while the prepared suede pyramids are large and nonuniform, the requirement on the original surface state of a silicon chip and the chemical consumption are both high, the service life of the solution used is short, the suede preparation repeatability is poor, a large amount of isopropyl alcohol volatilizes, and the operation is difficult as the solution needs to be stirred continuously, which results in that a high proportion of the suede prepared has a poor appearance and the conversion rate of cell slice is low.

To address the technical problem existing in ordinary suede preparation technologies, a catalyst for aiding in the preparation of suede is needed with which a chemical reaction can be carried out uniformly and the concentration of a solution and a reaction speed can be controlled better.

SUMMARY OF THE INVENTION

The object of the invention is to provide an additive for preparing suede on a monocrystalline silicon chip, the additive, when used to prepare suede on a monocrystalline silicon chip, can form uniform, tiny and dense suede pyramids without using a lot of isopropyl alcohol or ethanol, thus greatly reducing the chemical oxygen demand of a suede preparation liquid, and consequentially, the invention reduces suede preparation cost and environmental pollution and improves the technical stability of crystalline silicon solar cell and therefore has a good practical value.

To achieve the purpose above, the invention provides an additive for preparing suede on a monocrystalline silicon chip, which comprises: polyethylene glycol, sodium benzoate, citric acid, hydrolytic polymaleic anhydride, sodium acetate and water.

Preferably, the mass percent of each component of the additive for preparing suede on a monocrystalline silicon chip is as follows: polyethylene glycol: 1-20%, sodium benzoate: 0.1-2.0%, citric acid: 1.0-5.0%, hydrolytic polymaleic anhydride: 1.0-5.0%, sodium acetate: 0.1-1.0%, and water: the rest percent.

Preferably, the water is deionized water.

The invention also provides a suede preparation liquid for preparing suede on a monocrystalline silicon chip, which contains the aforementioned additive for preparing suede on a monocrystalline silicon chip and an aqueous alkali in a mass ratio of 0.2-5:100, wherein the aqueous alkali is the aqueous solution of an inorganic or organic alkali.

Preferably, the aqueous alkali is 0.5-3 wt % of aqueous sodium hydroxide or potassium hydroxide solution.

The invention also provides a method for preparing suede on a monocrystalline silicon chip, by using which suede can be formed on the surface of a monocrystalline silicon chip with the foregoing suede preparation liquid.

Preferably, the suede is prepared on the surface of the monocrystalline silicon chip at a suede preparation temperature of 75-90 degrees centigrade for a suede preparation time of 500-1500 s.

The method for preparing suede on a monocrystalline silicon chip specifically includes the following steps:

1) preparing a suede preparation additive: adding 1-20% by mass of polyethylene glycol, 0.1-2.0% by mass of sodium benzoate, 1.0-5.0% by mass of citric acid, 1.0-5.0% by mass of hydrolytic polymaleic anhydride and 0.1-1.0% by mass of sodium acetate into the rest percent by mass of water, mixing the components uniformly into the suede preparation additive, wherein the water is preferably deionized water;

2) preparing a suede preparation liquid: adding the suede preparation additive prepared in step 1) into an aqueous alkali, uniformly mixing the suede preparation additive and the aqueous alkali into the suede preparation liquid, wherein the mass ratio of the suede preparation liquid to the aqueous alkali is 0.2-5:100, and the aqueous alkali is the aqueous solution of an inorganic or organic alkali and is preferably 0.5-3 wt % of aqueous sodium hydroxide or potassium hydroxide solution;

3) immersing a monocrystalline silicon chip into the suede preparation liquid prepared in step 2) to prepare suede on the surface of the monocrystalline silicon chip at 75-90 degrees centigrade for 500-1500 s.

After suede is formed on the surface of a silicon chip with the suede preparation additive using the suede preparation method, the whole surface of the silicon chip has a uniform luster and is uniformly covered by pyramids having a size of about 1-6 um.

The invention has the following advantages and beneficial effects: an additive for preparing suede on a monocrystalline silicon chip and the use method thereof are provided, the additive, when used to prepare suede on a monocrystalline silicon chip, can form uniform, tiny and dense suede pyramids without using a lot of isopropyl alcohol or ethanol, thus greatly reducing the chemical oxygen demand of the suede preparation liquid, and consequentially, the invention reduces suede preparation cost and environmental pollution and improves the technical stability of crystalline silicon solar cell and therefore has a good practical value.

After suede is prepared with the suede preparation additive disclosed herein using the method disclosed herein, the pyramids on the suede are tiny and uniformly distributed, thus improving the rate of the finished cell slice products, increasing the fill factor of solar cell slices and improving the photoelectric conversion efficiency of solar cell slices. Besides, the suede preparation additive disclosed herein which contains no isopropyl alcohol or ethanol is nontoxic, non-corrosive, non-irritant, flameless and non-explosive and causes no pollution to environment, moreover, the suede preparation additive is easy to prepare and use with cheap devices and is excellent in repeatability.

BRIEF DESCRIPTION OF THE DRAWINGS

FIG. 1 is a planer view illustrating the suede on the surface of a silicon chip obtained in embodiment 3 of the invention and observed under a scanning electron microscope.

DETAILED DESCRIPTION OF THE PREFERRED EMBODIMENTS

The specific implementation mode of the invention is described below in detail with reference to accompanying drawings when read in conjunction with embodiments. The embodiments are merely illustrative of the technical solution of the invention more readily but are not to be construed as limiting the protection scope of the invention.

The specific technical solution of the invention is as follows:

Embodiment 1

A method for preparing suede on a monocrystalline silicon chip specifically includes the following steps:

1) preparing a suede preparation additive: adding 1 g polyethylene glycol-600, 0.1 g sodium benzoate, 1 g citric acid, 1 g hydrolytic polymaleic anhydride, 0.1 g sodium acetate into deionized water to obtain 100 g suede preparation additive solution;

2) preparing a suede preparation liquid: dissolving 250 g NaOH in deionized water to obtain 50 kg aqueous alkali, and dissolving the 100 g suede preparation additive prepared in step 1) in the aqueous alkali to obtain the suede preparation liquid;

3) preparing suede: immersing a monocrystalline silicon chip into the suede preparation liquid prepared in step 2) to prepare suede on the surface of the monocrystalline silicon chip at a suede preparation temperature of 75 degrees centigrade for a suede preparation time of 1500 s.

Embodiment 2

A method for preparing suede on a monocrystalline silicon chip specifically includes the following steps:

1) preparing a suede preparation additive: adding 20 g polyethylene glycol-200, 2 g sodium benzoate, 5 g citric acid, 5 g hydrolytic polymaleic anhydride, 1 g sodium acetate into deionized water to obtain 100 g suede preparation additive solution;

2) preparing a suede preparation liquid: dissolving 60 g NaOH in deionized water to obtain 2 kg aqueous alkali, and dissolving the 100 g suede preparation additive prepared in step 1) into the aqueous alkali to obtain the suede preparation liquid;

3) preparing suede: immersing a monocrystalline silicon chip into the suede preparation liquid prepared in step 2) to prepare suede on the surface of the monocrystalline silicon chip at a suede preparation temperature of 90 degrees centigrade for a suede preparation time of 500 s.

Embodiment 3

A method for preparing suede on a monocrystalline silicon chip specifically includes the following steps:

1) preparing a suede preparation additive: adding 15 g polyethylene glycol-400, 1 g sodium benzoate, 2.5 g citric acid, 3 g hydrolytic polymaleic anhydride, 0.5 g sodium acetate into deionized water to obtain 100 g suede preparation additive solution;

2) preparing a suede preparation liquid: dissolving 100 g KOH into deionized water to obtain 10 kg aqueous alkali, and dissolving the 100 g suede preparation additive prepared in step 1) into the aqueous alkali to obtain the suede preparation liquid;

3) preparing suede: immersing a monocrystalline silicon chip into the suede preparation liquid prepared in step 2) to prepare suede on the surface of the monocrystalline silicon chip at a suede preparation temperature of 80 degrees centigrade for a suede preparation time of 700 s.

FIG. 1 shows a planer picture of the suede on the surface of a silicon chip obtained in embodiment 3 of the invention and observed under a scanning electron microscope, it can be seen from FIG. 1 that the surface of the silicon chip is uniformly covered by pyramids, wherein most of the surface of the silicon chip is covered by the pyramids having a small size of 1-4 um.

The mentioned above is only preferred embodiments, it should be appreciated that various modification and variations can be devised by those skilled in the art without departing from the technical principle of the invention and such modification and variations should fall within the protection scope of the invention.

What is claimed is:

1. An additive comprising: polyethylene glycol, sodium benzoate, citric acid, hydrolytic polymaleic anhydride, sodium acetate and water; wherein the mass percent of each component of the additive is as follows: polyethylene glycol: 1-20%, sodium benzoate: 1.0-2.0%, citric acid: 1.0-5.0%, hydrolytic polymaleic anhydride: 1.0-5.0%, sodium acetate: 0.1-1.0%, and water: the remaining percentage.

2. The additive according to claim 1, wherein the water is deionized water.

3. A preparation liquid, comprising: the additive of claim 1 and an aqueous alkali in a mass ratio of 0.2-5:100, wherein the aqueous alkali is the aqueous solution of an inorganic or organic alkali.

4. The preparation liquid according to claim 3, wherein the aqueous alkali is 0.5-3 wt % of aqueous sodium hydroxide or potassium hydroxide solution.

5. The method for preparing a monocrystalline silicon chip comprising the following steps:

1) preparing a preparation additive: adding 1-20% by mass of polyethylene glycol, 0.1-2% by mass of sodium benzoate, 1.0-5.0% by mass of citric acid, 1.0-5.0% by mass of hydrolytic polymaleic anhydride and 0.1-1.0% by mass of sodium acetate into the rest percent by mass of water, mixing the components uniformly into the preparation additive;

2) preparing a preparation liquid: adding the suede preparation additive prepared in step 1) into an aqueous alkali, uniformly mixing the preparation additive mixture and the aqueous alkali into the preparation liquid, wherein the mass ratio of the preparation liquid to the aqueous alkali is 0.2-5:100, and the aqueous alkali is the aqueous solution of an inorganic or organic alkali;

3) immersing a monocrystalline silicon chip into the preparation liquid prepared in step 2) at a temperature of 75-90 degrees centigrade for a time of 500-1500 s.

6. A preparation liquid, comprising: the additive of claim 1 and an aqueous alkali in a mass ratio of 0.2-5:100, wherein the aqueous alkali is the aqueous solution of an inorganic or organic alkali.

7. A preparation liquid, comprising: the additive of claim 2 and an aqueous alkali in a mass ratio of 0.2-5:100, wherein the aqueous alkali is the aqueous solution of an inorganic or organic alkali.

8. A method for preparing a monocrystalline silicon chip with the preparation liquid of claim 4.

\* \* \* \* \*